(12) United States Patent
Chiba et al.

(10) Patent No.: US 10,126,162 B2
(45) Date of Patent: Nov. 13, 2018

(54) WEIGHING DEVICE USING FILTERING TO IMPROVE ACCURACY

(71) Applicant: Ishida Co., Ltd., Kyoto (JP)

(72) Inventors: Toshiyuki Chiba, Ritto (JP); Emi Mizuno, Ritto (JP); Ken Iwakawa, Ritto (JP)

(73) Assignee: Ishida Co., Ltd., Kyoto (JP)

( * ) Notice: Subject to any disclaimer, the term of this patent is extended or adjusted under 35 U.S.C. 154(b) by 163 days.

(21) Appl. No.: 15/127,353

(22) PCT Filed: Mar. 17, 2015

(86) PCT No.: PCT/JP2015/057882
§ 371 (c)(1),
(2) Date: Sep. 19, 2016

(87) PCT Pub. No.: WO2015/141670
PCT Pub. Date: Sep. 24, 2015

(65) Prior Publication Data
US 2017/0131137 A1    May 11, 2017

(30) Foreign Application Priority Data

Mar. 20, 2014 (JP) .................................. 2014-057725

(51) Int. Cl.
*G01G 11/00* (2006.01)
*G01G 23/10* (2006.01)
(Continued)

(52) U.S. Cl.
CPC ............. *G01G 23/37* (2013.01); *G01G 11/00* (2013.01); *G01G 11/003* (2013.01); *G01G 11/04* (2013.01);
(Continued)

(58) Field of Classification Search
CPC ...... G01G 11/003; G01G 11/04; G01G 23/37; G01G 11/00; G01G 19/035; G01G 23/10; G01R 13/0272
See application file for complete search history.

(56) References Cited

U.S. PATENT DOCUMENTS 4,951,763 A * 8/1990 Zimmerman .......... G01G 15/00
177/164
5,300,736 A * 4/1994 Ehrhardt ................ G01G 15/00
177/1
(Continued)

FOREIGN PATENT DOCUMENTS

CN    101467012 A    6/2009
CN    101542901 A    9/2009
(Continued)

OTHER PUBLICATIONS

Notification of Transmittal of Translation of the International Preliminary Report on Patentability and Translation of Written Opinion of the International Searching Authority; PCT/JP2015/057882 dated Sep. 29, 2016.
(Continued)

*Primary Examiner* — Randy Gibson
(74) *Attorney, Agent, or Firm* — Studebaker & Brackett PC

(57) ABSTRACT

A weighing device includes: a weighing cell which weighs an article and outputs an original signal corresponding to the weight of the weighed article; a filter unit which performs a filtering process on the original signal output from the weighing cell; a controller which makes a waveform of a weighing signal subjected to the filtering process be displayed on a touch panel; and a storage unit which stores at least one of the original signal and the weighing signal, wherein the controller predicts and generates the waveforms of a plurality of weighing signals in a case of performing a
(Continued)

plurality of filtering processes having different characteristics on the original signal or the weighing signal stored in the storage unit, and makes the waveforms of the plurality of weighing signals be displayed on the touch panel.

10 Claims, 5 Drawing Sheets

(51) Int. Cl.
    *G01G 23/37*     (2006.01)
    *G01R 13/00*     (2006.01)
    *G01G 19/03*     (2006.01)
    *G01G 11/04*     (2006.01)
    *G01R 13/02*     (2006.01)

(52) U.S. Cl.
    CPC ........... *G01G 19/035* (2013.01); *G01G 23/10* (2013.01); *G01R 13/0272* (2013.01)

(56) References Cited

U.S. PATENT DOCUMENTS

| | | | | |
|---|---|---|---|---|
| 6,195,617 | B1* | 2/2001 | Miller | G01R 13/345 345/440 |
| 6,567,760 | B1* | 5/2003 | Kikuchi | G01R 13/347 702/66 |
| 2002/0170753 | A1* | 11/2002 | Clare | G01G 17/04 177/45 |
| 2007/0095123 | A1 | 5/2007 | Aikawa et al. | |
| 2007/0217694 | A1* | 9/2007 | Sullivan | G01R 13/0272 382/232 |
| 2010/0228521 | A1 | 9/2010 | Hamamoto | |
| 2014/0160144 | A1* | 6/2014 | Martin | G01R 13/0227 345/589 |
| 2014/0249711 | A1* | 9/2014 | Hanson | G07C 5/08 701/29.1 |

FOREIGN PATENT DOCUMENTS

| | | |
|---|---|---|
| CN | 103038616 A | 4/2013 |
| EP | 2615434 A1 | 7/2013 |
| JP | H03-282220 A | 12/1991 |
| JP | H09-113348 A | 5/1997 |
| JP | 2002-372451 A | 12/2002 |
| JP | 2003-337062 A | 11/2003 |
| JP | 2007-101333 A | 4/2007 |
| JP | 2011-145106 A | 7/2011 |
| JP | 2016-024075 A | 2/2016 |
| JP | 2016-053546 A | 4/2016 |

OTHER PUBLICATIONS

International Search Report issued in PCT/JP2015/057882; dated Jun. 16, 2015.
Notice of Allowance issued by the Japanese Patent Office dated Jun. 21, 2016, which corresponds to Japanese Patent Application No. 2016-508734 and is related to U.S. Appl. No. 15/127,353.
Extended European Search Report (EESR) dated Sep. 4, 2017, from corresponding EP Appl No. 15764975.7, 7 pp.

* cited by examiner

WEIGHING DEVICE USING FILTERING TO IMPROVE ACCURACY

TECHNICAL FIELD

The present invention relates to a weighing device.

BACKGROUND ART

As a weighing device of the related art, a weighing device is known which weighs the weight of an article which is carried in by a transport conveyor, by a weigher, and performs a sorting determination of the weight of the article, based on a weighing signal of the weigher at a timing set in advance from the carrying-in of the article, and is provided with storage means for storing a weighing signal corresponding to the weight of the article weighed by the weigher, weight waveform display means for displaying the weighing signal stored in the storage means, as a waveform, and timing display means for displaying the above timing on the same screen as the waveform of the weighing signal (refer to, for example, Patent Literature 1).

CITATION LIST

Patent Literature

[Patent Literature 1] Japanese Unexamined Patent Publication No. H03-282220

SUMMARY OF INVENTION

Technical Problem

In the above device, a timing when a weighing value is acquired after filtering can be visually confirmed, and therefore, it is possible to acquire a weighing value at an appropriate timing. However, in the above device, although appropriateness for an acquiring timing of a weighing value based on a weighing result can be realized, it is not possible to know whether or not selected filter conditions are appropriate.

An object of the present invention is to provide a weighing device in which it is possible to reliably determine appropriate filter conditions even without actually performing weighing.

Solution to Problem

According to an aspect of the present invention, there is provided a weighing device including: a weighing unit which weighs an article and outputs an original signal corresponding to a weight of the weighed article; a filter unit which performs a filtering process on the original signal output from the weighing unit; a control unit which makes a waveform of a weighing signal subjected to the filtering process be displayed on a display unit; and a storage unit which stores at least one of the original signal and the weighing signal, wherein the control unit predicts and generates waveforms of a plurality of weighing signals in a case of performing a plurality of filtering processes having different characteristics on the original signal or the weighing signal stored in the storage unit, and makes the waveforms of the plurality of weighing signals be displayed on the display unit.

In this weighing device, the control unit predicts and generates waveforms of a plurality of weighing signals in a case of performing a plurality of filtering processes having different characteristics on the original signal or the weighing signal stored in the storage unit, and makes the waveforms of the plurality of weighing signals be displayed on the display unit. In this manner, by predicting (simulating) and generating waveforms in a case of performing a plurality of filtering processes having different characteristics, and displaying the waveforms on the display unit, a worker who sets a filter can visually confirm the effect of each filter. Therefore, a worker can determine an optimal filter in accordance with a use environment or a setting environment by comparing one waveform and other waveforms displayed on the display unit. In this manner, in the weighing device, it is possible to reliably determine appropriate filter conditions even without actually performing weighing. As a result, in the weighing device, an appropriate filter is selected, and therefore, accurate weighing can be realized.

In an embodiment, the waveforms of the plurality of weighing signals may be displayed overlappingly on the display unit. In this manner, the waveforms in a case where the filtering process is carried out are displayed overlappingly, whereby the effect by a filter can be more easily compared in one waveform and other waveforms.

In an embodiment, the control unit may make a reference of at least one of weighing accuracy and capacity be displayed on the display unit. In this way, a worker can select a waveform in which the effect of a filter is most appropriate in relation to weighing accuracy, or a waveform in which desired capacity can be obtained, among the plurality of waveforms displayed on the display unit, based on the references. Therefore, it is possible to easily select a filter in which high weighing accuracy or high processing capacity is obtained. The reference of the weighing accuracy or the capacity may be for limiting, for example, the amplitude of a waveform and may be for indicating a timing of performing weighing in a waveform.

In an embodiment, the control unit may make a plurality of reference values of the reference be displayed on the display unit. In this manner, by displaying the reference values of the reference, it is possible to select a filter fitted to the weighing accuracy or the capacity which is required by a worker, based on the reference values.

In an embodiment, the control unit may make a waveform of the stored weighing signal be displayed to overlap the waveforms of the plurality of weighing signals predicted and generated, on the display unit. In this manner, the waveform of the weighing signal stored in the storage unit and the waveforms of the plurality of weighing signals predicted and generated are displayed overlappingly on the display unit, whereby it is possible to more significantly confirm the effects of the filtering process.

In an embodiment, the weighing signal stored in the storage unit may be a weighing signal when an article is actually weighed in the weighing unit. In this manner, by storing a weighing signal output when an article is actually weighed in the weighing unit, and generating a waveform in a case where the filtering process is performed on the weighing signal, it is possible to perform the selection of a filter corresponding to an article which is actually weighed.

In an embodiment, the weighing unit may perform weighing while conveying the article. In this manner, in contrast with a case of performing stationary weighing, in a case of performing moving weighing, it is possible to perform setting according to actual influence on weighing, such as an article which is weighed rattling during conveyance, or a shift of the position of the center of gravity in a conveyance direction of an article. Therefore, the above configuration of the present invention in which it is possible to easily select an optimal filter which minimizes such an influence on weighing is particularly effective in a weighing device which performs moving weighing.

In an embodiment, the control unit may make a length dimension of the article and a conveyance speed of the article be displayed on the display unit. A conveyance unit of the weighing device is usually divided into three parts; a weighing part in which weighing is performed, a carrying-in part which carries an article into the weighing part, and a carrying-out part which carries the article out from the weighing part. In the weighing of an article, a weighing signal at a timing when the article has been completely placed on the weighing part is used. That is, a weighing signal when an article is located straddling the weighing part and the carrying-in part or the carrying-out part is not used. In the present invention, the length dimension and the conveyance speed of an article are displayed on the display unit. From the length dimension and the conveyance speed of the article, it is possible to determine a time until the article will be completely transferred from the carrying-in part to the weighing part. In this way, it is possible to ascertain the lower limit of a timing of weighing, and therefore, it is possible to take in a weighing signal at a more appropriate timing.

In an embodiment, the weighing device may further include a selection part that is configured to select a manual selection mode or an automatic selection mode, in the manually selection mode a filter used in the filtering process is manually selected, and in the automatic selection mode the filter is automatically selected, wherein the control unit selects a filter in which variation in the waveform of the weighing signal becomes the smallest at a weighing timing, among a plurality of the filters, in a case where the automatic selection mode is selected, and makes a waveform of the weighing signal in a case of performing a filtering process by the selected filter, and a waveform of the weighing signal in a case of performing a filtering process by other filters other than the selected filter, be displayed to be distinguished from each other on the display unit. In this way, it is possible to visually confirm the waveform of a weighing signal processed by an automatically selected filter, and the waveforms of weighing signals processed by other filters. Therefore, a worker can confirm the effect of the automatically selected filter by comparing one waveform and other waveforms displayed on the display unit.

Advantageous Effects of Invention

According to the present invention, it is possible to reliably determine appropriate filter conditions even without actually performing weighing.

DESCRIPTION OF EMBODIMENTS

Figure 1:
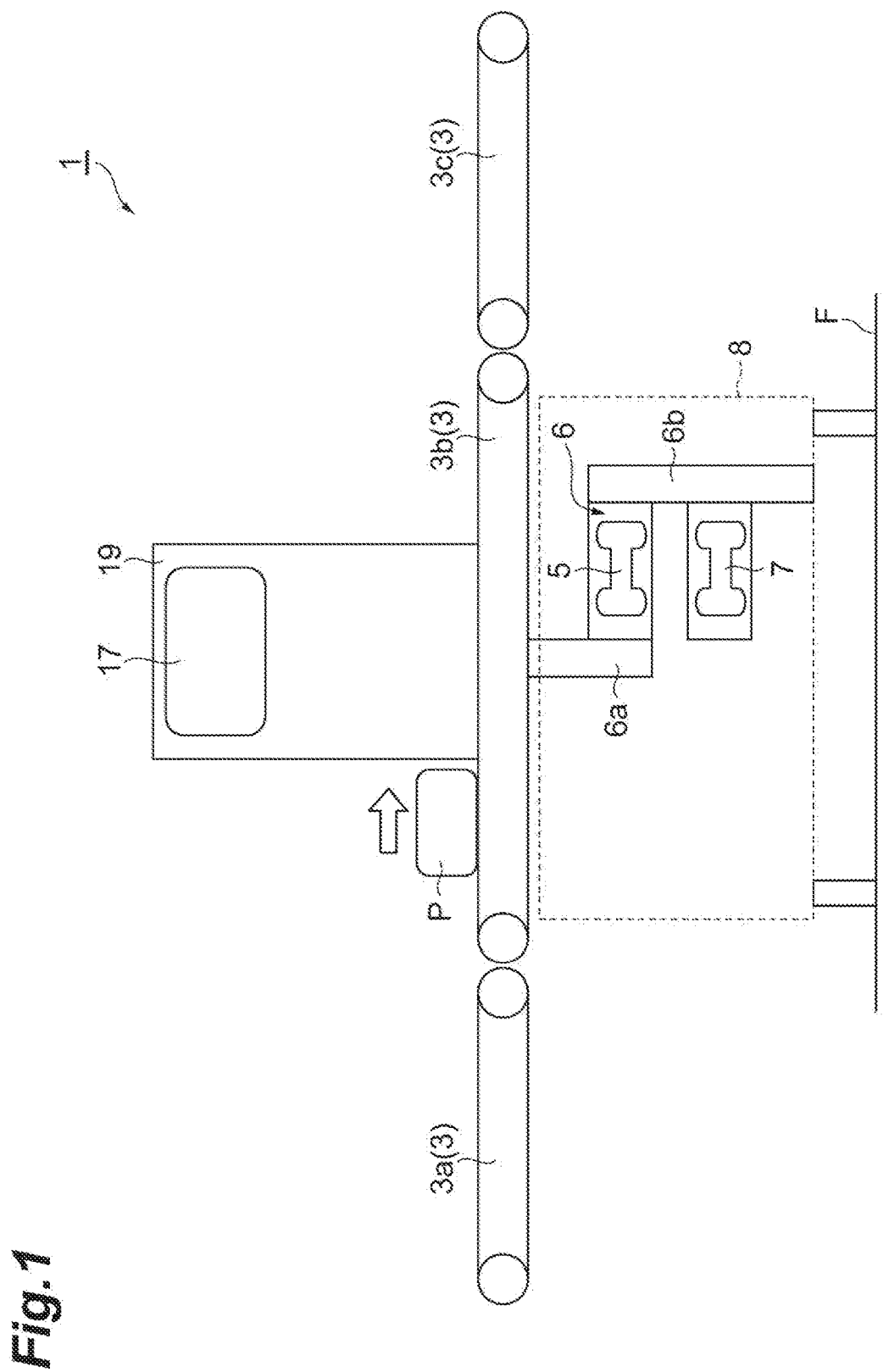
FIG. 1 is a diagram showing a weighing device according to an embodiment.

Hereinafter, a preferred embodiment of the present invention will be described in detail with reference to the accompanying drawings. In the description of the drawings, identical or corresponding elements are denoted by the same reference numerals, and overlapping description is omitted.

Figure 2:
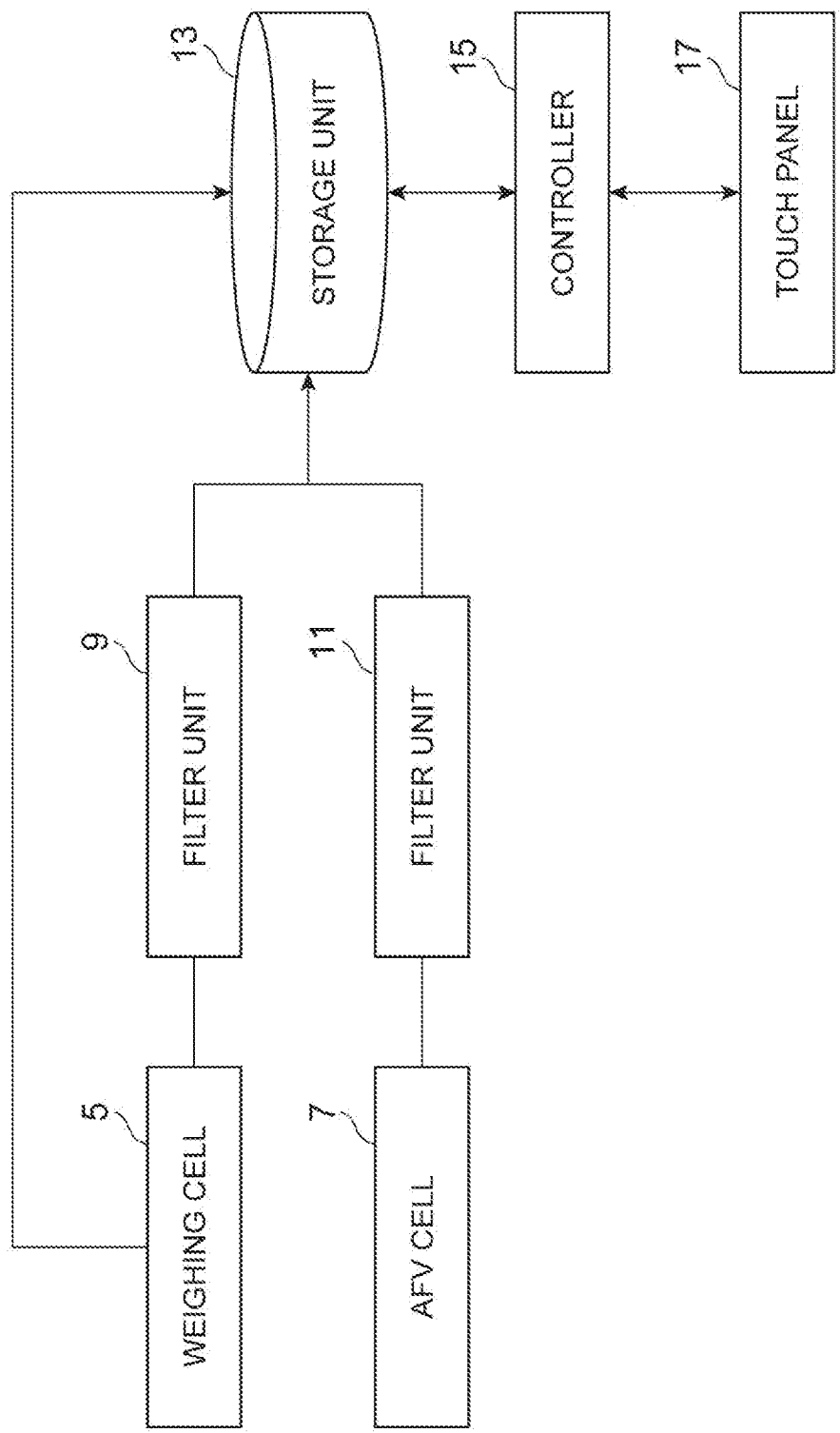
FIG. 2 is a diagram showing the configuration of the weighing device shown in FIG. 1.

FIG. 1 is a diagram schematically showing a weighing device according to an embodiment. FIG. 2 is a diagram showing the configuration of the weighing device shown in FIG. 1. A weighing device 1 shown in FIGS. 1 and 2 is a device for weighing the weight of an article P while conveying the article P in the direction of an arrow in FIG. 1. The weighing device 1 is disposed in the last line of a production line, for example.

As shown in FIGS. 1 and 2, the weighing device 1 is provided with a conveyor (a conveyance unit) 3, a weighing cell (a weighing unit) 5, an AFV (Anti Floor Vibration) cell (a disturbance vibration detection unit) 7, a filter unit 9, a filter unit 11, a storage unit 13, a controller (a control unit) 15, and a touch panel (a display unit) 17.

The conveyor 3 is provided with a first conveyor part 3a, a second conveyor part 3b, and a third conveyor part 3c. The first conveyor part 3a, the second conveyor part 3b, and the third conveyor part 3c are disposed in this order from the upstream side in a conveyance direction of the article P. That is, the first conveyor part 3a and the third conveyor part 3c are disposed at positions at which the second conveyor part 3b is sandwiched therebetween. The weighing of the article P is performed when the article P is located on the second conveyor part 3b. The first conveyor part 3a is a conveyor for carrying the article P in the second conveyor part 3b. For example, a metal detector (not shown) is provided at the first conveyor part 3a. The third conveyor part 3c is a conveyor for carrying the article P out from the second conveyor part 3b. For example, a sorter (not shown) for sorting the article P with the weight deviating from a proper range is provided at the third conveyor part 3c.

The weighing cell 5 weighs the article P which is located on the second conveyor part 3b. The weighing cell 5 is provided with a strain body 6 which is subjected to compression and tension according to a load, and is built into a frame 8. The strain body 6 has a movable rigid body part 6a which supports the second conveyor part 3b, and a fixed rigid body part 6b which is fixed to the frame 8. In the weighing cell 5, a plurality of strain gauges (not shown) adhered to the strain body 6 are connected to a Wheatstone bridge circuit. The weighing cell 5 takes an electrical signal according to a load out of the above circuit and outputs the signal as an original signal. The original signal which is output from the weighing cell 5 is an analog signal. For this reason, the original signal is converted into a digital signal by an A/D conversion unit (not shown). The A/D-converted original signal is output to the filter unit 9 and the storage unit 13.

The filter unit 9 performs a filtering process on the original signal output from the weighing cell 5. The filter unit 9 removes noise of the original signal output from the weighing cell 5, through the filtering process. The filter unit 9 is made so as to be able to perform a plurality of filtering processes having different characteristics. Specifically, the filter unit 9 has, for example, a notch filter (a band-stop filter) (hereinafter referred to as a first filter) which attenuates noise of the frequency of a rotating body such as a roller or a motor of the conveyor 3, and a 3D filter (hereinafter referred to as a second filter) capable of changing the amount of attenuation of each frequency band according to the weight of the article P. If the filter unit 9 receives the original signal output from the weighing cell 5, the filter unit 9 performs a predetermined filtering process on the original signal and outputs a weighing signal subjected to the filtering process to the storage unit 13. The selection of the first filter and the second filter in the filter unit 9 is made such that manual setting by a user and setting by the controller 15 are possible.

The AFV cell 7 detects disturbance vibration of the weighing device 1 which includes the weighing cell 5. The AFV cell 7 is provided at the fixed rigid body part 6b of the weighing cell 5 and detects vibration which is transmitted from a floor F on which the weighing device 1 is disposed, to the weighing device 1, vibration of the conveyor 3, or the like. The AFV cell 7 detects disturbance vibration and outputs a vibration signal corresponding to the disturbance vibration. The vibration signal which is output from the AFV cell 7 is an analog signal. For this reason, the vibration signal is converted into a digital signal by an A/D conversion unit. The AD-converted vibration signal is output to the filter unit 11.

The filter unit 11 performs a filtering process on the vibration signal output from the AFV cell. The filter unit 11 removes noise of the vibration signal output from the AFV cell 7, through the filtering process. If the filter unit 11 receives the vibration signal output from the AFV cell 7, the filter unit 11 performs a predetermined filtering process on the vibration signal and outputs a vibration signal subjected to the filtering process to the storage unit 13.

The storage unit 13 stores various signals. The storage unit 13 stores the original signal output from the weighing cell 5, the weighing signal output from the filter unit 9, and the vibration signal output from the filter unit 11 (the AFV cell 7).

The controller 15 is configured to include a CPU (Central Processing Unit), a RAM (Random Access Memory), a ROM (Read Only Memory), and the like. The controller 15 determines the weight of the article P, based on the weighing signal output from the filter unit 9 and stored in the storage unit 13 and the vibration signal output from the filter unit 11. Specifically, the controller 15 generates a weighing correction signal in which an error of the weighing signal caused by disturbance vibration is corrected by subtracting the vibration signal from the weighing signal, that is, a vibration component is removed from the weighing signal. At this time, since the weighing signal and the vibration signal have different characteristics, the controller 15 adds a predetermined coefficient to the vibration signal and then removes the vibration signal from the weighing signal.

The controller 15 determines the weight of the article P, based on the weighing correction signal, and outputs weight information indicating the weight of the article P, to the touch panel 17. In a case where the sorter is provided at the third conveyor part 3c, when the controller 15 determines that the weight of the article P deviates from a proper range set in advance, the controller 15 outputs an actuating signal to the sorter such that the sorter sorts the article P (excludes the article P from the line).

The touch panel 17 is provided in an operating part 19 provided to be erect behind the second conveyor part 3b. If the touch panel 17 receives display information output from the controller 15, the touch panel 17 displays an image based on the display information. If the touch panel 17 receives an input from a worker (a user), the touch panel 17 outputs input information indicating the input content, to the control 15.

Figure 3:
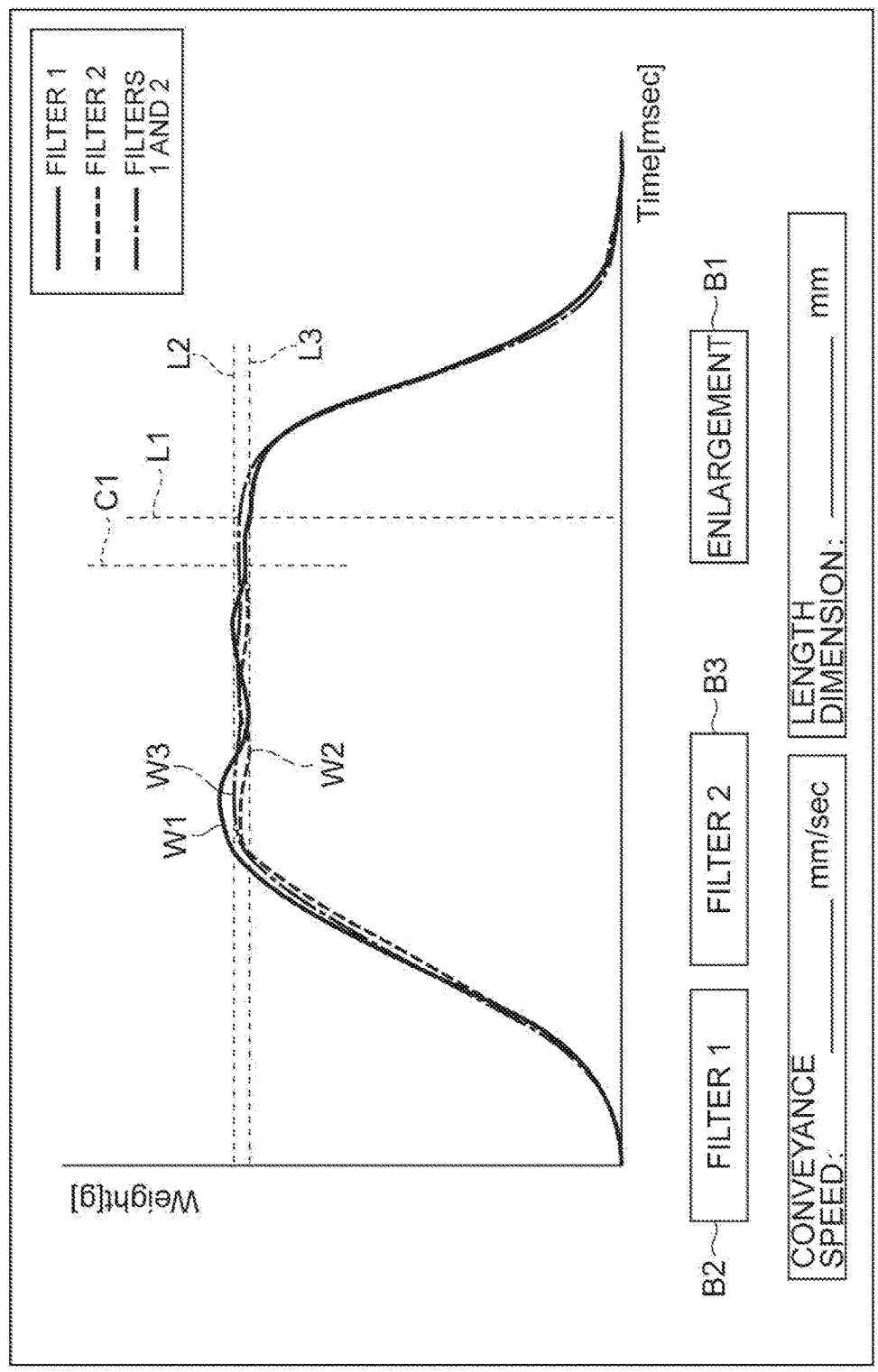
FIG. 3 is a diagram showing an example of a screen which is displayed on a touch panel.
Figure 4:
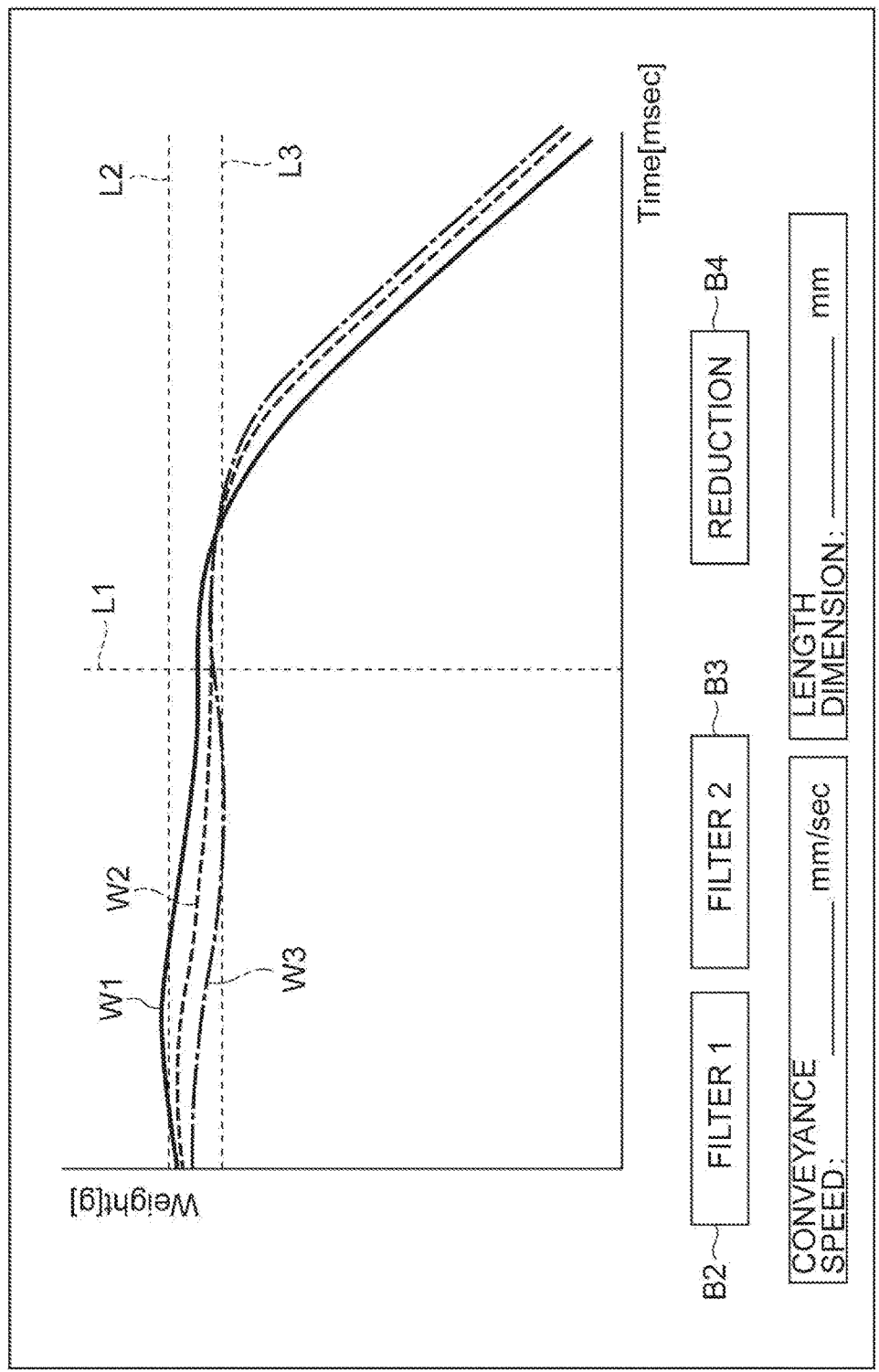
FIG. 4 is a diagram showing an example of a screen which is displayed on the touch panel.
Figure 5:
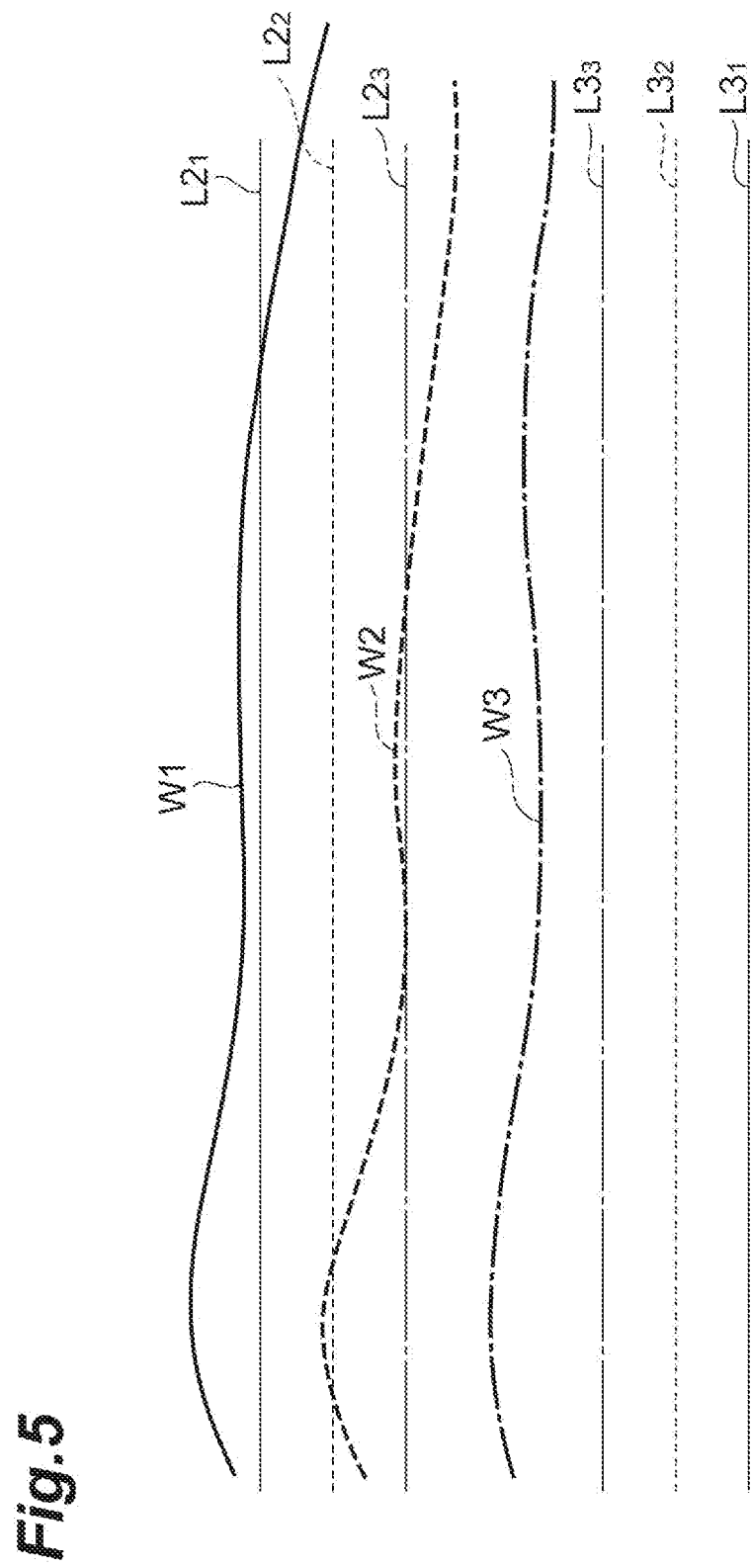
FIG. 5 is a diagram showing an example of a screen which is displayed on the touch panel.

As described above, in the weighing device 1 of this embodiment, the setting of a filter in the filter unit 9 can be made by a worker (a user). Hereinafter, an operation of the weighing device 1 when a worker sets a filter will be described with reference to FIGS. 3 to 5. FIGS. 3 to 5 are diagrams showing an example of a screen which is displayed on the touch panel.

First, if the power supply of the weighing device 1 is turned on, the controller 15 makes a menu screen be displayed on the touch panel 17. In the menu screen, a "filter setting button" for starting the setting of a filter in the filter unit 9 is displayed. A worker who performs the setting of a filter presses the filter setting button.

If the controller 15 confirms that in the touch panel 17, the filter setting button is pressed by a worker, the controller 15 makes a filter selection screen be displayed on the touch panel 17, as shown in FIG. 3. Specifically, the controller 15 makes a first filter waveform W1 subjected to the filtering process by the first filter, a second filter waveform W2 subjected to the filtering process by the second filter, and a third filter waveform W3 subjected to the filtering process by the first and second filters be displayed overlappingly on the touch panel 17. In FIG. 3, the first filter waveform W1 is shown by a solid line, the second filter waveform W2 is shown by a dashed line, and the third filter waveform W3 is shown by a dot-and-dash line. The same information is displayed on the touch panel 17.

The controller 15 predicts and generates the first to third filter waveforms W1 to W3 in a case where the filtering process is performed on the weighing signal obtained by actually weighing the article P in the weighing cell 5 and stored in the storage unit 13, by the first filter and/or the second filter, and makes the first to third filter waveforms W1 to W3 be displayed on the touch panel 17. The controller 15 outputs display information instructing the touch panel 17 on the display of the first to third filter waveforms W1 to W3, to the touch panel 17. The touch panel 17 displays the first to third filter waveforms W1 to W3 overlappingly, based on the received display information.

Further, the controller 15 makes a cross-shaped cursor C be displayed on the touch panel 17. The cursor C is for specifying a location for enlargement in the first to third filter waveforms W1 to W3. The cursor C is moved by, for example, an operation of a jog dial provided in the operating part 19, or a touch of an arbitrary position in the touch panel 17. In a case where the position of the cursor C is determined, a worker presses a button B1 of "enlargement" displayed on the touch panel 17. If the controller 15 confirms that the button B1 of "enlargement" is pressed, the controller 15 makes a screen in which the first to third filter waveforms W1 to W3 which are at the position indicated by the center of the cursor C are enlarged, for example, 10 times be displayed on the touch panel 17, as shown in FIG. 4. If the controller 15 confirms that a "reduction" button shown in FIG. 4 is pressed by a worker, the controller 15 performs return from the screen shown in FIG. 4 to the screen shown in FIG. 3.

Further, the controller 15 makes a sampling timing reference line L1, an accuracy reference line L2, and an accuracy reference line L3 be displayed to overlap the first to third filter waveforms W1 to W3 on the touch panel 17. The sampling timing reference line L1 indicates an allowable value of a timing when the weighing of the articles P is performed (a timing when the original signal is acquired) and is a reference relating to the processing capacity of the weighing device 1.

The accuracy reference line L2 and the accuracy reference line L3 are references indicating an ideal range in which the amplitudes of the first to third filter waveforms W1 to W3 have to fall. The amplitude of any one of the first to third filter waveforms W1 to W3 is made to fall between the accuracy reference line L2 and the accuracy reference line L3, whereby noise of the original signal is favorably attenuated, and thus a weighing result with less external influences is obtained. It is favorable if the accuracy reference line L2 and the accuracy reference line L3 are appropriately set according to a desired weighing accuracy or the like.

Further, in each of the accuracy reference line L2 and the accuracy reference line L3, a plurality of reference values may be set in stages, as shown in FIG. 5. In the accuracy reference line L2, as shown in FIG. 5, a first accuracy reference value $L2_1$, a second accuracy reference value $L2_2$, and a third accuracy reference value $L2_3$ are set. Similarly, in the accuracy reference line L3, a first accuracy reference value $L3_1$, a second accuracy reference value $L3_2$, and a third accuracy reference value $L3_3$ are set. The first accuracy reference value $L2_1$, the second accuracy reference value $L2_2$, and the third accuracy reference value $L2_3$ satisfy the relationship of the first accuracy reference value $L2_1$>the second accuracy reference value $L2_2$>the third accuracy reference value $L2_3$. The first accuracy reference value $L3_1$, the second accuracy reference value $L3_2$, and the third accuracy reference value $L3_3$ satisfy the relationship of the first accuracy reference value $L3_1$<the second accuracy reference value $L3_2$<the third accuracy reference value $L3_3$. That is, in a case where the amplitude of a waveform falls between the third accuracy reference value $L2_3$ and the third accuracy reference value $L3_3$, the highest weighing accuracy is obtained. In the example shown in FIG. 5, the third filter waveform W3 has the highest accuracy, and then, the accuracy becomes lower in the order of the second filter waveform W2 and the first filter waveform W1. It is favorable if each reference value in the accuracy reference line L2 and the accuracy reference line L3 is appropriately set according to a design.

Further, the controller 15 makes a conveyance speed of the article P and the length dimension of the article P be displayed in the filter selection screen of the touch panel 17. The conveyance speed of the article P is obtained from, for example, the rotation frequency of a motor which drives the conveyor 3. The length dimension of the article P is obtained from, for example, detection by a sensor or an input by a worker in the operating part 19.

A worker confirms the first to third filter waveforms W1 to W3, based on the sampling timing reference line L1, the accuracy reference line L2, and the accuracy reference line L3, in FIG. 3 or 4, and presses a "filter 1" button B2 and/or a "filter 2" button B3 for a desired filter. If the button B2 and/or the button B3 is pressed, the controller 15 stores the filter according to the pressed button in the storage unit 13. By the above, the filter which is used in the filter unit 9 is set.

As described above, in the weighing device 1 of this embodiment, the controller 15 predicts and generates the first to third filter waveforms W1 to W3 of a plurality of weighing signals in a case where the filtering process of the first and second filters is performed on the weighing signal obtained by actually weighing the article P in the weighing cell 5 and stored in the storage unit 13, and makes the first to third filter waveforms W1 to W3 be displayed on the touch panel 17. In this manner, by predicting (simulating) and generating waveforms in a case where a plurality of filtering processes having different characteristics is performed, and displaying the waveforms on the touch panel 17, a worker who sets a filter can visually confirm the effects of the respective filters (the first filter and the second filter). Therefore, a worker can determine an optimal filter in accordance with a use environment or a setting environment by comparing the first to third filter waveforms W1 to W3 displayed on the touch panel 17. In this manner, in the weighing device 1, it is possible to reliably determine appropriate filter conditions even without actually performing weighing. As a result, in the weighing device 1, an appropriate filter is selected, and therefore, accurate weighing can be realized.

In the weighing device 1 of this embodiment, the controller 15 makes the accuracy reference line L2 and the accuracy reference line L3 which are the references for weighing accuracy, and the sampling timing reference line L1 which is the reference for capacity be displayed to overlap the first to third filter waveforms W1 to W3 on the touch panel 17. In this way, a worker can select a waveform in which the effect of a filter is most appropriate in relation to weighing accuracy, or a waveform in which desired capacity can be obtained, among the plurality of waveforms displayed on the touch panel 17, based on the references. Therefore, it is possible to easily select a filter in which high weighing accuracy or high processing capacity is obtained.

In the weighing device 1 of this embodiment, the controller 15 makes the first accuracy reference value $L2_1$, the second accuracy reference value $L2_2$, and the third accuracy reference value $L2_3$ which are the reference values of the accuracy reference line L2, and the first accuracy reference value $L3_1$, the second accuracy reference value $L3_2$, and the third accuracy reference value $L3_3$ which are the reference values of the accuracy reference line L3 be displayed on the touch panel 17, as shown in FIG. 5. In this manner, by displaying the reference values of the accuracy reference line L2 and the accuracy reference line L3, it is possible to select a filter fitted to the weighing accuracy or the capacity which is required by a worker, based on the reference values.

In the weighing device 1 of this embodiment, the weighing cell 5 weighs the article P which is conveyed by the conveyor 3. In this manner, in contrast with a case of performing stationary weighing, in a case of performing moving weighing, it is possible to perform setting according to actual influence on weighing, such as the article P which is weighed rattling during conveyance, or a shift of the position of the center of gravity in the conveyance direction of the article P. Therefore, the above configuration of this embodiment in which it is possible to easily select an optimal filter which minimizes such an influence on weighing is particularly effective in the weighing device 1 which performs moving weighing.

In the weighing device 1 of this embodiment, the controller 15 makes the length dimension of the article P and the conveyance speed of the article P be displayed on the touch panel 17. The conveyor 3 is divided into three parts; the second conveyor part 3b (a weighing part) in which weighing is performed, the first conveyor part 3a (a carrying-in part) which carries the article P into the second conveyor part 3b, and the third conveyor part 3c (a carrying-out part) which carries the article P out from the second conveyor part 3b. In the weighing of the article P, a weighing signal at a timing when the article P has been completely placed on the second conveyor part 3b is used. That is, a weighing signal when the article P is located straddling the second conveyor part 3b and the first conveyor part 3a or the third conveyor part 3c is not used. In this embodiment, the controller 15 makes the length dimension and the conveyance speed of the article P be displayed on the touch panel 17. From the length dimension and the conveyance speed of the article P, it is possible to determine a time until the article P will be completely transferred from the first conveyor part 3a to the second conveyor part 3b. In this way, it is possible to ascertain the lower limit of a timing of weighing, and therefore, it is possible to take in a weighing signal at a more appropriate timing.

The present invention is not limited to the above-described embodiment. For example, in the above-described embodiment, in the filter setting screen, a form in which the controller 15 makes the first to third filter waveforms W1 to W3 be displayed overlappingly on the touch panel 17 has been described as an example. However, the controller 15 may make a waveform based on a weighing signal stored in the storage unit 13 be displayed to overlap the first to third filter waveforms W1 to W3 in the filter setting screen. In this case, it is possible to more significantly confirm the effect by the filtering process.

In the above-described embodiment, the controller 15 makes the first to third filter waveforms W1 to W3 be displayed overlappingly on the touch panel 17. However, the first to third filter waveforms W1 to W3 may not be displayed overlappingly. The first to third filter waveforms W1 to W3 may be displayed separately.

In the above-described embodiment, a form in which the controller 15 predicts and generates the first to third filter waveforms W1 to W3 in a case where the filtering process of each filter is performed on a weighing signal obtained by actually weighing the article P in the weighing cell 5 and stored in the storage unit 13 has been described as an example. However, the controller 15 may predict and generate a waveform in a case where the filtering process of each filter is performed on the original signal stored in the storage unit 13.

In the above-described embodiment, a form in which a worker selects an appropriate filter among the first filet to the third filter by comparing the first to third filter waveforms W1 to W3 displayed on the touch panel 17 has been described as an example. However, the selection of a filter may be performed by the controller 15. In this case, a form capable of selecting a manual selection mode of manually performing the selection of a filter and an automatic selection mode of automatically performing the selection of a filter is also acceptable. That is, a selection part capable of selecting the manual selection mode and the automatic selection mode may be provided. The selection part may be a button which is displayed on the screen of the touch panel 17, and may be a button (a switch) or the like which is mechanically provided.

An operation of the controller 15 in a case of having the manual selection mode and the automatic selection mode will be described. If the power supply of the weighing device 1 is turned on, the controller 15 makes a menu screen be displayed on the touch panel 17. In the menu screen, a "manual selection mode button" for selecting the manual selection mode, and an "automatic selection mode button" for selecting the automatic selection mode are displayed. If the "manual selection mode button" is pressed by a worker, the controller 15 makes the "filter setting button" for starting the setting of a filter be displayed. A series of operations in the manual selection mode are as described above.

On the other hand, if the "automatic selection mode button" is pressed by a worker, the controller 15 selects a filter in which variation in the waveform of a weighing signal becomes the smallest at a weighing timing, among a plurality of filters, and makes the waveform of a weighing signal in a case where the filtering process is performed by the selected filter, and the waveform of a weighing signal in a case where the filtering process is performed by other filters other than the selected filter be displayed to be distinguished from each other on the touch panel 17.

Specifically, the controller 15 selects a filter in which variation in the waveform of a weighing signal becomes the smallest at a weighing timing, among the first to third filters. The weighing timing is a timing when the original signal is acquired, and is a timing which is set based on, for example, the sampling timing reference line L1. The controller 15 predicts and generates the first filter waveform W1 subjected to the filtering process by the first filter, the second filter waveform W2 subjected to the filtering process by the second filter, and the third filter waveform W3 subjected to the filtering process by the first and second filters, and selects a waveform in which variation is the smallest at a weighing timing, among the first to third filter waveforms W1 to W3. The waveform in which variation is the smallest is, for example, a waveform in which the amplitude falls between the accuracy reference line L2 and the accuracy reference line L3 shown in FIG. 4, and more preferably, between the third accuracy reference value $L2_3$ and the third accuracy reference value $L3_3$ shown in FIG. 5, and is a waveform in which variation in the amplitude and the period of a waveform is the smallest. That is, the waveform in which variation is the smallest is a waveform in which the highest weighing accuracy is obtained, and noise of the original signal is most, favorably attenuated.

The controller 15 selects a filter having a waveform in which variation becomes the smallest at a weighing timing, based on the first to third filter waveforms W1 to W3. If the controller 15 selects a filter, the controller 15 makes a filter waveform by the selected filter and filter waveforms by other filters be displayed to be distinguished from each other on the touch panel 17. The controller 15 makes, for example, the first to third filter waveforms W1 to W3 be displayed to be distinguished from each other by colors on the touch panel 17.

Specifically, the controller 15 makes the third filter waveform W3 be displayed in "red" and makes the first filter waveform W1 and the second filter waveform W2 be displayed in "blue", for example, in a case where it is determined that variation is the smallest in the third filter waveform W3 by the third filter. As a method of distinguishing the waveforms from each other, a line type (a solid line, a dashed line, or the like) of the waveform may be changed, and other methods are also acceptable.

If the controller 15 selects a filter having a waveform in which variation becomes the smallest at a weighing timing, the controller 15 stores the filter in the storage unit 13. Further, if the controller 15 makes the first to third filter waveforms W1 to W3 be displayed on the touch panel 17, the controller 15 may make, for example, a pop-up confirming the setting of a filter (for example, "May the third filter be set?") be displayed. If, for example, an "OK" button displayed in the pop-up is pressed by a worker, the controller 15 stores the selected filter in the storage unit 13. On the other hand, if a "NO" button displayed in the pop-up is pressed by a worker, the controller 15 may make a pop-up for selecting the first filter or the second filter be displayed. If a button for selecting the "first filter" or a button for selecting the "second filter" displayed in the pop-up is pressed by a worker, the controller 15 stores a filter corresponding to the pressed button in the storage unit 13.

In the configuration described above, a worker can visually confirm the waveform of a weighing signal processed by an automatically selected filter and the waveforms of weighing signals processed by other filters. Therefore, a worker can confirm the effect of the automatically selected filter by comparing one waveform and other waveforms displayed on the display unit.

In the above-described embodiment, reference values are set in the accuracy reference line L2 and the accuracy reference line L3. However, a reference value may also be set in the sampling timing reference line L1.

In the above-described embodiment, as an operation display part, the touch panel 17 has been described as an example. However, the operation display part is not limited thereto. A configuration is also acceptable in which a display is used as the display unit and a keyboard or the like is used as the operating part.

In the above-described embodiment, the weighing device 1 which is provided with the conveyor 3 and performs weighing while conveying the article P has been described as an example. However, the form of the weighing device is not limited thereto. The present invention can also be applied to a combination weighing device or the like.

REFERENCE SIGNS LIST

1: weighing device
5: weighing cell (weighing unit)
9: filter unit
13: storage unit
15: controller (control unit)
17: touch panel (display unit)
W1: first filter waveform
W2: second filter waveform
W3: third filter waveform

The invention claimed is:

1. A weighing device comprising:
   a scale which weighs an article and outputs an original signal corresponding to a weight of the weighed article;
   a filter which performs a filtering process on the original signal output from the scale;
   a controller which makes a waveform of a weighing signal subjected to the filtering process be displayed on a display; and
   a storage which stores at least one of the original signal and the weighing signal,
   wherein the controller predicts and generates waveforms of a plurality of weighing signals in a case of performing a plurality of filtering processes having different characteristics on the original signal or the weighing signal stored in the storage, and makes the waveforms of the plurality of weighing signals be displayed on the display.

2. The weighing device according to claim 1, wherein the controller makes the waveforms of the plurality of weighing signals be displayed overlappingly on the display.

3. The weighing device according to claim 1, wherein the controller makes a reference of at least one of weighing accuracy and capacity be displayed on the display.

4. The weighing device according to claim 3, wherein the controller makes a plurality of reference values of the reference be displayed on the display.

5. The weighing device according to claim 1, wherein the controller makes a waveform of the stored weighing signal be displayed to overlap the waveforms of the plurality of weighing signals predicted and generated, on the display.

6. The weighing device according to claim 1, wherein the weighing signal stored in the storage is a weighing signal when the article is actually weighed in the scale.

7. The weighing device according to claim 1, wherein the scale performs weighing while conveying the article.

8. The weighing device according to claim 7, wherein the controller makes a length dimension of the article and a conveyance speed of the article be displayed on the display.

9. The weighing device according to claim 1, further comprising:
   a selector that is configured to select a manual selection mode or an automatic selection mode, in the manually selection mode a filter used in the filtering process is manually selected, and in the automatic selection mode the filter is automatically selected,
   wherein the controller selects a filter in which variation in the waveform of the weighing signal becomes the smallest at a weighing timing, among a plurality of the filters, in a case where the automatic selection mode is selected, and makes a waveform of the weighing signal in a case of performing a filtering process by the selected filter, and a waveform of the weighing signal in a case of performing a filtering process by other filters other than the selected filter, be displayed to be distinguished from each other on the display.

10. The weighing device according to claim 2, wherein the controller selects a waveform from among the overlappingly displayed waveforms, and adopts a filter corresponding to the selected waveform.

* * * * *